US008889460B2

(12) United States Patent
Hsu et al.

(10) Patent No.: US 8,889,460 B2
(45) Date of Patent: Nov. 18, 2014

(54) SIDEWALL FOR BACKSIDE ILLUMINATED IMAGE SENSOR METAL GRID AND METHOD OF MANUFACTURING SAME

(71) Applicant: Taiwan Semiconductor Manufacturing Company, Ltd., Hsin-Chu (TW)

(72) Inventors: Hung-Wen Hsu, Tainan (TW); Shih-Chang Liu, Alian Township (TW); Yeur-Luen Tu, Taichung (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/087,133

(22) Filed: Nov. 22, 2013

(65) Prior Publication Data

US 2014/0065756 A1 Mar. 6, 2014

Related U.S. Application Data

(62) Division of application No. 13/087,192, filed on Apr. 14, 2011, now Pat. No. 8,610,229.

(51) Int. Cl.
*H01L 27/146* (2006.01)
(52) U.S. Cl.
CPC ...... *H01L 27/14685* (2013.01); *H01L 27/1464* (2013.01); *H01L 27/14627* (2013.01); *H01L 27/14623* (2013.01)
USPC .. 438/65; 257/432; 257/E27.13; 257/E31.127
(58) Field of Classification Search
USPC ............... 257/432, E27.13, E31.127; 438/65
See application file for complete search history.

(56) References Cited

U.S. PATENT DOCUMENTS

| | | | |
|---|---|---|---|
| 2005/0194611 A1* | 9/2005 | Jeong | 257/146 |
| 2009/0108389 A1* | 4/2009 | Inoue | 257/435 |
| 2009/0168181 A1* | 7/2009 | Su et al. | 359/586 |

* cited by examiner

*Primary Examiner* — Marc Armand
(74) *Attorney, Agent, or Firm* — Haynes and Boone, LLP

(57) ABSTRACT

The present disclosure provides an image sensor device and a method for manufacturing the image sensor device. An exemplary image sensor device includes a substrate having a front surface and a back surface; a plurality of sensor elements disposed at the front surface of the substrate, each of the plurality of sensor elements being operable to sense radiation projected towards the back surface of the substrate; a radiation-shielding feature disposed over the back surface of the substrate and horizontally disposed between each of the plurality of sensor elements; a dielectric feature disposed between the back surface of the substrate and the radiation-shielding feature; and a metal layer disposed along sidewalls of the dielectric feature.

20 Claims, 7 Drawing Sheets

SIDEWALL FOR BACKSIDE ILLUMINATED IMAGE SENSOR METAL GRID AND METHOD OF MANUFACTURING SAME

PRIORITY DATA

The present application is a divisional application of U.S. patent application Ser. No. 13/087,192, filed Apr. 14, 2011, which is incorporated by reference in its entirety.

BACKGROUND

Integrated circuit (IC) technologies are constantly being improved. Such improvements frequently involve scaling down device geometries to achieve lower fabrication costs, higher device integration density, higher speeds, and better performance. Along with the advantages realized from reducing geometry size, improvements are being made directly to the IC devices. One such IC device is an image sensor device. An image sensor device includes a pixel array (or grid) for detecting light and recording an intensity (brightness) of the detected light. The pixel array responds to the light by accumulating a charge—the more light, the higher the charge. The charge can then be used (for example, by other circuitry) to provide a color and brightness that can be used for a suitable application, such as a digital camera. Common types of pixel grids include a charge-coupled device (CCD) image sensor or complimentary metal-oxide-semiconductor (CMOS) image sensor device.

One type of image sensor device is a backside illuminated (BSI) image sensor device. BSI image sensor devices are used for sensing a volume of light projected towards a backside surface of a substrate (which supports the image sensor circuitry of the BSI image sensor device). The pixel grid is located at a front side of the substrate, and the substrate is thin enough so that light projected towards the backside of the substrate can reach the pixel grid. BSI image sensor devices provide a high fill factor and reduced destructive interference, as compared to front-side illuminated (FSI) image sensor devices. However, due to device scaling, improvements to BSI technology are continually being made to further improve BSI image sensor device quantum efficiency. Accordingly, although existing BSI image sensor devices and methods of fabricating these BSI image sensor devices have been generally adequate for their intended purposes, as device scaling down continues, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
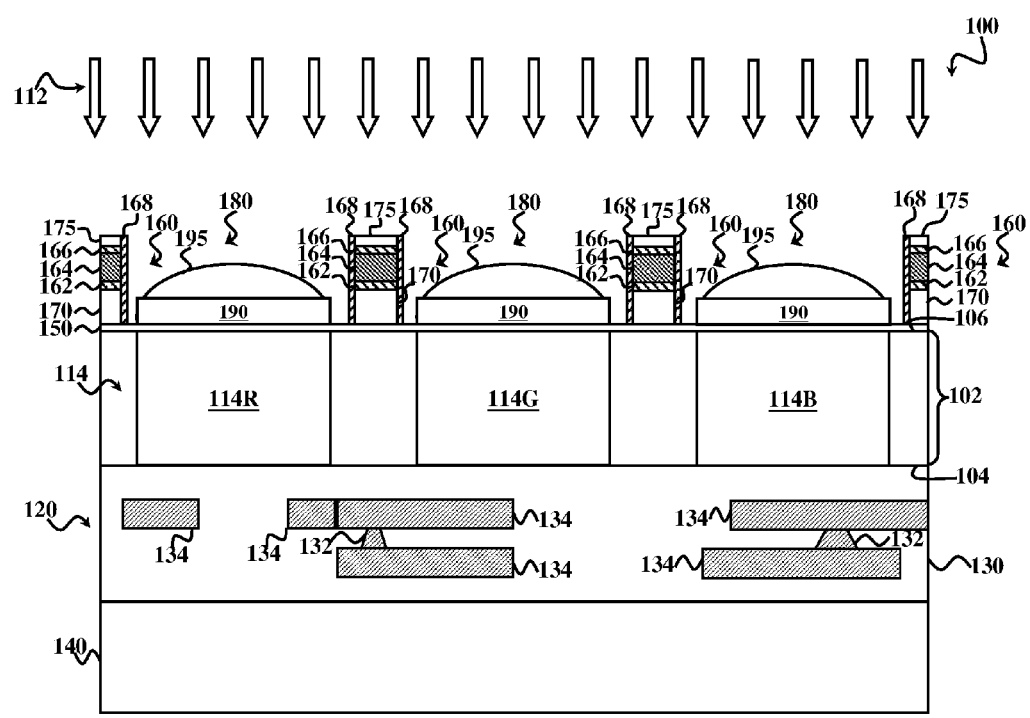
FIG. 1 is a diagrammatic sectional side view of an integrated circuit device that includes a radiation-shielding feature with metal sidewalls according to various aspects of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

FIG. 1 is a diagrammatic sectional side view, in portion or entirety, of an embodiment of an integrated circuit device 100 according to various aspects of the present disclosure. In the depicted embodiment, integrated circuit device 100 includes a backside illuminated (BSI) image sensor device. The integrated circuit device 100 may be an integrated circuit (IC) chip, system on chip (SoC), or portion thereof, that includes various passive and active microelectronic components, such as resistors, capacitors, inductors, diodes, metal-oxide-semiconductor field effect transistors (MOSFET), complementary MOS (CMOS) transistors, bipolar junction transistors (BJT), laterally diffused MOS (LDMOS) transistors, high power MOS transistors, fin-like field effect transistors (FinFET), other suitable components, or combinations thereof. FIG. 1 has been simplified for the sake of clarity to better understand the inventive concepts of the present disclosure. Additional features can be added in the integrated circuit device 100, and some of the features described below can be replaced or eliminated for other embodiments of the integrated circuit device 100.

The integrated circuit device 100 includes a substrate 102 having a front surface 104 and a back surface 106. In the depicted embodiment, the substrate 102 is a semiconductor substrate including silicon. Alternatively or additionally, the substrate 102 includes another elementary semiconductor, such as germanium and/or diamond; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. The substrate 102 may be a semiconductor on insulator (SOI). The substrate 102 may include a doped epi layer, a gradient semiconductor layer, and/or a semiconductor layer overlying another semiconductor layer of a different type, such as a silicon layer on a silicon germanium layer.

The substrate may be a p-type or an n-type substrate depending on design requirements of the integrated circuit device 100. In the depicted embodiment, the substrate 102 is a p-type substrate. P-type dopants that the substrate 102 are doped with include boron, gallium, indium, other suitable p-type dopants, or combinations thereof. Because the depicted integrated circuit device 100 includes a p-type doped substrate, doping configurations described below should be read consistent with a p-type doped substrate. The integrated circuit device 100 may alternatively include an n-type doped substrate, in which case, the doping configurations described below should be read consistent with an n-type doped substrate (for example, read with doping configurations having an opposite conductivity). N-type dopants that the substrate 102 can be doped with include phosphorus, arsenic, other suitable n-type dopants, or combinations thereof. The p-type substrate 102 may include various p-type doped regions and/or n-type doped regions. Doping may be implemented using a process such as ion implantation or diffusion in various steps and techniques.

The substrate 102 may include isolation features (not illustrated), such as local oxidation of silicon (LOCOS) and/or shallow trench isolation (STI), to separate (or isolate) various regions and/or devices formed on or within the substrate 102. For example, the isolation features may sensor elements 114 from one another. The isolation features include silicon oxide, silicon nitride, silicon oxynitride, other suitable materials, or combinations thereof. The isolation features are formed by any suitable process. For example, forming an STI includes a photolithography process, etching a trench in the substrate (for example, by using a dry etching and/or wet etching), and filling the trench (for example, by using a chemical vapor deposition process) with dielectric material. The filled trench may have a multi-layer structure, such as a thermal oxide liner layer filled with silicon nitride or silicon oxide.

As noted above, the integrated circuit device 100 includes sensor elements 114 (also referred to as pixels). The sensor elements 114 detects an intensity (brightness) of radiation, such as incident radiation (light) 112, directed toward the back surface 106 of the substrate 102. In the depicted embodiment, the incident radiation 112 is visual light. Alternatively, the radiation 112 could be infrared (IR), ultraviolet (UV), X-ray, microwave, other suitable radiation type, or combinations thereof. In the depicted embodiment, the sensor elements 114 are configured to correspond with a specific light wavelength, such as a red (R), a green (G), or a blue (B) light wavelength. In other words, the sensor elements 114 are configured to detect an intensity (brightness) of a particular light wavelength. In the depicted embodiment, the sensor elements 114 are pixels in a pixel array.

In the depicted embodiment, the sensor elements 114 include a photodetector, such as a photodiode, that includes a light sensing region (or photo-sensing region) 114R, 114G, and 114B, respectively, which detect intensity (brightness) of red, green, and blue light wavelengths, respectively. The light sensing regions (or photo-sensing regions) 114R, 114G, and 114B are doped regions having n-type and/or p-type dopants formed in the substrate 102, specifically along the front surface 104 of the substrate 102. In the depicted embodiment, the light sensing regions 114R, 114G, and 114B may be an n-type doped region. The light sensing regions 114R, 114G, and 114B are formed by a method such as diffusion and/or ion implantation. The sensor elements 114 may further include one or more pinned layers. For example, the sensor elements 114 may include a pinned layer disposed in the substrate at the front surface 104, a pinned layer disposed in the substrate at the back surface 106, or both such that the sensor elements 114 are disposed between pinned layers disposed respectively at the front and back surfaces of the substrate. The pinned layers are doped layers, which may be doped n-type or p-type depending on design requirements of the sensor elements 114. The sensor elements 114 further include various transistors, such as a transfer transistor (not illustrated), a reset transistor (not illustrated), a source-follower transistor (not illustrated), a select transistor (not illustrated), other suitable transistors, or combinations thereof. The light sensing regions 114R, 114G, and 114B and various transistors (which can collectively be referred to as pixel circuitry) allow the sensor elements 114 to detect intensity of the particular light wavelength. Additional circuitry, input, and/or outputs may be provided to the sensor elements 114 to provide an operation environment for the sensor elements 114 and/or support communication with the sensor elements 114.

The integrated circuit device 100 further includes a multilayer interconnect (MLI) 120 disposed over the front surface 104 of the substrate 102, including over the sensor elements 114. The MLI 120 is coupled to various components of the BSI image sensor device, such as the sensor elements 114, such that the various components of the BSI image sensor device are operable to properly respond to illuminated light (imaging radiation). The MLI 120 includes various conductive features, which may be vertical interconnects, such as contacts and/or vias 132, and/or horizontal interconnects, such as lines 134. The various conductive features 132 and 134 may include conductive materials, such as metal. In an example, metals including aluminum, aluminum/silicon/copper alloy, titanium, titanium nitride, tungsten, polysilicon, metal silicide, or combinations thereof, may be used, and the various conductive features 132 and 134 may be referred to as aluminum interconnects. Aluminum interconnects may be formed by a process including physical vapor deposition (PVD), chemical vapor deposition (CVD), or combinations thereof. Other manufacturing techniques to form the various conductive features 132 and 134 may include photolithography processing and etching to pattern conductive materials to form the vertical and horizontal interconnects. Still other manufacturing processes may be implemented to form the MLI 120, such as a thermal annealing to form metal silicide. The metal silicide used in the multilayer interconnects may include nickel silicide, cobalt silicide, tungsten silicide, tantalum silicide, titanium silicide, platinum silicide, erbium silicide, palladium silicide, or combinations thereof. Alternatively, the various conductive features 132 and 134 may be copper multilayer interconnects, which include copper, copper alloy, titanium, titanium nitride, tantalum, tantalum nitride, tungsten, polysilicon, metal silicide, or combinations thereof. The copper interconnects may be formed by a process including PVD, CVD, or combinations thereof. It is understood that the MLI 120 is not limited by the number, material, size, and/or dimension of the conductive features 132 and 134 depicted, and thus, the MLI 120 may include any number, material, size, and/or dimension of conductive features depending on design requirements of the integrated circuit device 100.

The various conductive features 132 and 134 of the MLI 120 are disposed in an interlayer (or inter-level) dielectric (ILD) layer 130. The ILD layer 130 may include silicon dioxide, silicon nitride, silicon oxynitride, TEOS oxide, phosphosilicate glass (PSG), borophosphosilicate glass (BPSG), fluorinated silica glass (FSG), carbon doped silicon oxide, Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, other suitable materials, or combinations thereof. The ILD layer 130 may have a multilayer structure. The ILD layer 130 may be formed by a technique including spin-on coating, CVD, sputtering, or other suitable processes. In an example, the MLI 120 and ILD 130 may be formed in an integrated process including a damascene process, such as a dual damascene process or single damascene process.

A carrier wafer 140 is disposed over the front surface 104 of the substrate 102. In the depicted embodiment, the carrier wafer 140 is bonded to the MLI 120. The carrier wafer 140 comprises silicon. Alternatively, the carrier wafer 140 comprises another suitable material, such as glass. The carrier wafer 140 can provide protection for the various features (such as the sensor elements 114) formed on the front surface 104 of the substrate 102, and can also provide mechanical strength and support for processing the back surface 106 of the substrate 102.

The integrated circuit device 100 further includes various features disposed over the back surface 106 of the substrate 102. For example, an antireflective layer 150 is disposed over the back surface 106 of the substrate 102. The antireflective layer 150 includes a dielectric material, such as silicon nitride or silicon oxynitride.

A radiation-shielding feature 160 (also referred to as a light-shielding feature 160) is disposed over the back surface of the substrate 102, and in the depicted embodiment, is disposed over the antireflective layer 150. The radiation-shielding feature 160 is positioned horizontally, such that it is disposed between the sensor elements 114. More specifically, in the depicted embodiment, a portion of the radiation-shielding feature 160 is horizontally disposed between each light sensing region 114R, 114G, and 114B. The radiation-shielding feature 160 achieves good color separation by reducing crosstalk among the various light sensing regions 114R, 114G, and 114B.

The radiation-shielding feature 160 includes a metal layer 162, a metal layer 164, and a metal layer 166. The radiation-shielding feature 160 may be formed by using a physical vapor deposition (PVD) process, a chemical vapor deposition (CVD) deposition process, or other suitable process to form the metal layers and patterning the metal layers to form metal features including the metal layers 162, 164, and 166. The metal layer 162 has a thickness of about 150 Å to about 250 Å, the metal layer 164 has a thickness of about 400 Å to about 800 Å, and the metal layer 166 has a thickness of about 150 Å to about 250 Å. In the depicted embodiment, the metal layer 162 has a thickness of about 200 Å, the metal layer 164 has a thickness of about 600 Å, and the metal layer 166 has a thickness of about 200 Å. The metal layers 162, 164, and 166 include a suitable metal material, such as titanium, titanium nitride, tantalum, tantalum nitride, aluminum, tungsten, copper, copper alloy, alloys thereof, or combinations thereof. In the depicted embodiment, the metal layers 162 and 166 are titanium-containing layers, such as titanium nitride layers, and the metal layer 164 is an aluminum-containing layer, such as an aluminum copper layer. The radiation-shielding feature 160 may include other material layers, such as semiconductor layers and/or dielectric layers, depending on design requirements of the device 100.

Sidewalls of the metal layers 162, 164, and 166 sometimes exhibit roughness, decreasing efficiency and effectiveness of the radiation-shielding feature 160. For example, the sidewall roughness of the metal layers 162, 164, and 166 may cause an increase in photon scattering, thereby weakening the ability of the radiation-shielding feature 160 to prevent crosstalk among the sensor elements 114. To address this issue, a metal layer 168 is disposed along sidewalls of the metal layers 162, 164, and 166 of the radiation-shielding feature 160. The metal layer 168 can be referred to as metal spacers of the radiation-shielding feature 160. The metal layer 168 has a thickness of about 50 Å to about 150 Å. The metal layer 168 includes a suitable metal material, such as titanium, titanium nitride, tantalum, tantalum nitride, aluminum, tungsten, copper, copper alloy, alloys thereof, or combinations thereof. In the depicted embodiment, the metal layer 168 is a titanium-containing layer, such as a titanium or titanium nitride layer. The metal layer 168 provides the radiation-shielding feature 160 with smooth sidewalls along the metal layers 162, 164, and 166. The metal layer 168 can thus reduce photon scattering and/or crosstalk among the sensor elements 114, which can provide the integrated circuit device 100 with improved quantum efficiency and improved color separation.

A dielectric layer 170 is disposed between the radiation-shielding feature 160 and the back surface 106 of the substrate 102. For example, the dielectric layer 170 is disposed between the antireflective layer 150 and the metal layer 162. The dielectric layer 170 has a thickness of about 200 Å to about 600 Å. In the depicted embodiment, the dielectric layer 170 has a thickness of about 600 Å. Further, in the depicted embodiment, the dielectric layer 170 is an oxide-containing layer. Typically, radiation can travel through the dielectric layer 170, which can contribute to increased crosstalk in the integrated circuit device 100. To address this, in the depicted embodiment, the metal layer 168 extends along sidewalls of the dielectric layer 170. The metal layer 168 along the sidewalls of the dielectric layer 170 prevents radiation from traveling through the dielectric layer 170, reducing cross talk among the sensor elements 114, which can further provide the integrated circuit device 100 with improved quantum efficiency and improved color separation. In the depicted embodiment, the dielectric layer 170 is a feature separate and apart from the radiation-shielding feature 160. Alternatively, the dielectric layer 170 may be considered as a part of the radiation-shielding feature 160.

An antireflective layer 175 may be disposed over the radiation-shielding feature 160, specifically over the metal layer 166. The antireflective layer 175 includes a dielectric material, such as silicon nitride or silicon oxynitride. The antireflective layer 175 has a thickness of about 250 Å to about 500 Å. The metal layer 168 may also extend along sidewalls of the antireflective layer 175. In the depicted embodiment, the antireflective layer 175 is a feature separate and apart from the radiation-shielding feature 160. Alternatively, the antireflective layer 175 may be considered as a part of the radiation-shielding feature 160.

The integrated circuit device 100 further includes color filters 190 and lenses 195 disposed over the back surface 106 of the substrate 102. The color filters 190 are disposed within the openings 180 formed by the radiation-shielding feature 160, and are aligned with respective light sensing regions 114R, 114G, and 114B of the sensor elements 114. In the depicted embodiment, the color filters 190 are disposed over the antireflective layer 150. The color filters 190 are designed so that each filters through light of a predetermined wavelength. For example, the color filter 190 aligned with the light sensing region 114R may be configured to filter through visible light of a red wavelength to the light sensing region 114R, the color filter 190 aligned with the light sensing region 114G may be configured to filter through visible light of a green wavelength to the light sensing region 114G, or the color filter 190 aligned with the light sensing region 114B may be configured to filter through visible light of a blue wavelength to the light sensing region 114B. The color filters 190 include any suitable material. In an example, the color filters 190 include a dye-based (or pigment-based) polymer for filtering out a specific frequency band (for example, a desired wavelength of light). Alternatively, the color filters 190 could include a resin or other organic-based material having color pigments.

The lenses 195, disposed over the back surface 106 of the substrate 102, are also disposed within the openings 180 formed by the radiation-shielding feature 160, and are aligned with respective light sensing regions 114A, 114G, and 114B of the sensor elements 114. In the depicted embodiment, the lenses 195 are disposed over the color filters 190. The lenses 195 may be in various positional arrangements with the sensor elements 114 and color filters 190, such that the lens 195 focuses the incident radiation 112 on the respective light sensing regions 114R, 114G, and 114B of the sensor elements 114. The lenses 195 include a suitable material, and may have a variety of shapes and sizes depending on an index of refraction of the material used for the lenses and/or a distance between the lenses and sensor elements 114. Alternatively, the position of the color filters 190 and lens layer 195 may be reversed, such that the lenses 190 are disposed between the back surface 106 of the substrate 102 and color filters 190. The present disclosure also contemplates the integrated circuit device 100 having a color filter layer disposed between lens layers.

In operation, the integrated circuit device 100 is designed to receive radiation 112 traveling towards the back surface 106 of the substrate 102. The lenses 195 direct the incident radiation 112 to the respective color filters 190. The light then passes from the color filters 190 through the antireflective layer 150 to the substrate 102 and corresponding sensor element 114, specifically to respective light sensing regions 114R, 114G, and 114B. Light passing through to the color filters 190 and sensor elements 114 may be maximized since the light is not obstructed by various device features (for example, gates electrodes) and/or metal features (for example, the conductive features 132 and 134 of the MLI 120) overlying the front surface 104 of the substrate 102. Light passing through is also maximized by the radiation-shielding feature 160 and metal layer 168 disposed along the sidewalls of the radiation-shielding feature 160 (and dielectric layer 170 in the depicted embodiment). As noted above, the metal layer 168 reduces photon scattering and crosstalk in the integrated circuit device 100. The desired wavelengths of light (for example, red, green, and blue light) are more efficiently allowed to pass through to the respective light sensing regions 114R, 114G, and 114B of the sensor elements 114. When exposed to the light, the light sensing regions 114R, 114G, and 114B of the sensor elements 114 produce and accumulate (collect) electrons, which may be converted to voltage signals.

Figure 2:
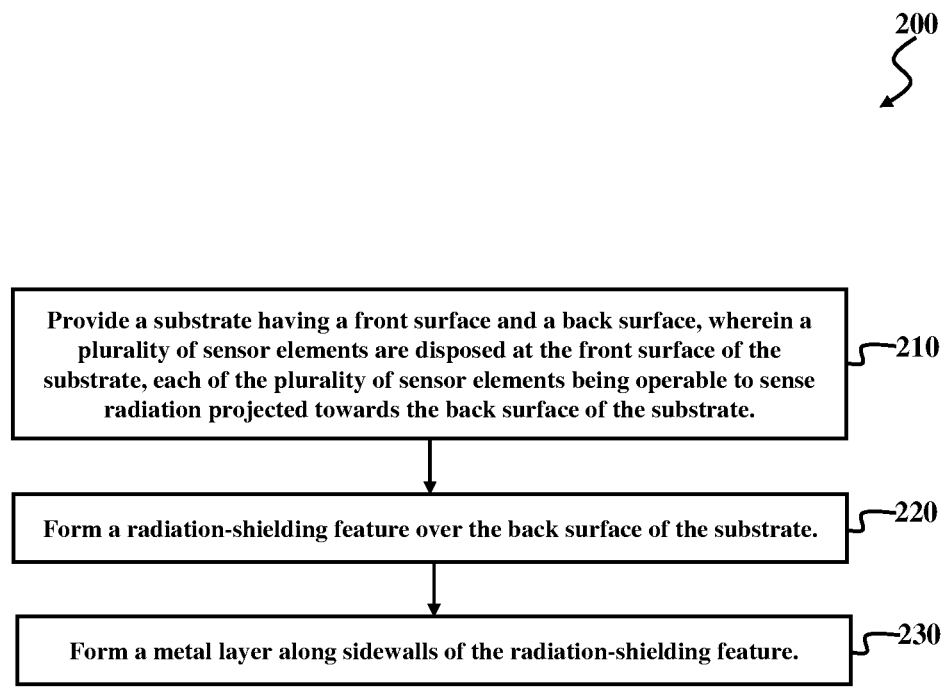
FIG. 2 is a flow chart of a method for fabricating a radiation-shielding feature having metal sidewalls for an integrated circuit device according to various aspects of the present disclosure.

FIG. 2 is a flow chart of a method 200 for forming a radiation-shielding feature having metal sidewalls for an integrated circuit device according to various aspects of the present disclosure. The method 200 begins at block 210 where a substrate is provided having a front surface and a back surface. A plurality of sensor elements are disposed at the front surface of the substrate, and each of the plurality of sensor elements is operable to sense radiation projected towards the back surface of the substrate. At block 220, a radiation-shielding feature is formed over the back surface of the substrate. For example, a plurality of metal layers are formed and patterned over the back surface of the substrate to form the radiation-shielding feature. The metal layers are patterned such that the radiation-shielding feature is disposed horizontally between each of the plurality of sensor elements. At block 230, a metal layer is formed along sidewalls of the radiation-shielding feature. For example, a metal layer is formed and etched over the back surface of the substrate, such that the metal layer remains along the sidewalls of the radiation-blocking feature. Additional steps can be provided before, during, and after the method 200, and some of the steps described can be replaced or eliminated for other embodiments of the method 200. The discussion that follows illustrates various embodiments of forming the radiation-shielding feature having metal sidewalls for the integrated circuit device that can be achieved according to the method 200 of FIG. 2.

FIGS. 3-7 are various diagrammatic sectional side views of an embodiment of an integrated circuit device 300 during various fabrication stages according to the method 200 of FIG. 2. In the depicted embodiment, integrated circuit device 300 includes a backside illuminated (BSI) image sensor device. The integrated circuit device 300 may be an integrated circuit (IC) chip, system on chip (SoC), or portion thereof, that includes various passive and active microelectronic components, such as resistors, capacitors, inductors, diodes, metal-oxide-semiconductor field effect transistors (MOSFET), complementary MOS (CMOS) transistors, bipolar junction transistors (BJT), laterally diffused MOS (LDMOS) transistors, high power MOS transistors, fin-like field effect transistors (FinFET), other suitable components, or combinations thereof. FIGS. 3-7 have been simplified for the sake of clarity to better understand the inventive concepts of the present disclosure. Additional features can be added in the integrated circuit device 300, and some of the features described below can be replaced or eliminated for additional embodiments of the integrated circuit device 300.

Figure 3:
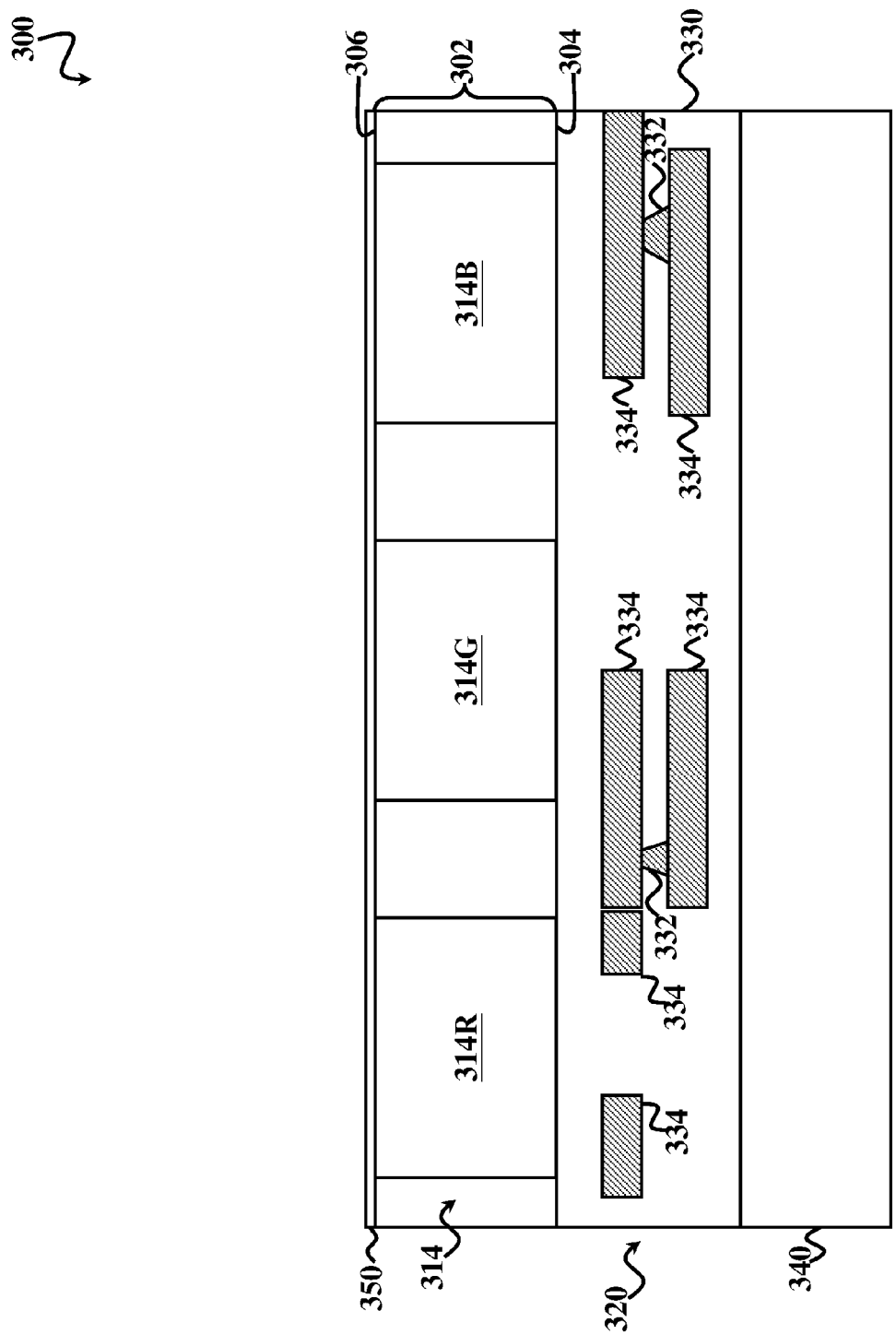
FIGS. 3-7 are diagrammatic sectional side views of an integrated circuit device at various fabrication stages according to the method of FIG. 2.

In FIG. 3, the integrated circuit device 300 includes a substrate 302 having a front surface 304 and a back surface 306. Sensor elements 314 are disposed at the front surface 304 of the substrate 302. Each sensor element 314 includes a respective light sensing region 314R, 314G, 314B. The substrate 302, sensor elements 314, and light sensing regions 314R, 314G, and 314B are respectively similar to the substrate 102, sensor elements 114, and light sensing regions 114R, 114G, and 114B described above with reference to FIG. 1. In the depicted embodiment, MLI structure 320 including conductive features 332 and 334 disposed in a dielectric layer 330 is disposed over the front surface 304 of the substrate 302, a carrier wafer 340 is disposed over the MLI structure 320, and an antireflective layer 350 is disposed over the back surface 306 of the substrate 302. The MLI structure 320, conductive features 332 and 334, dielectric layer 330, carrier wafer 340, and antireflective layer 350 are respectively similar to the MLI structure 120, conductive features 132 and 132, dielectric layer 130, carrier wafer 140, and antireflective layer 150 described above with reference to FIG. 1.

Figure 4:
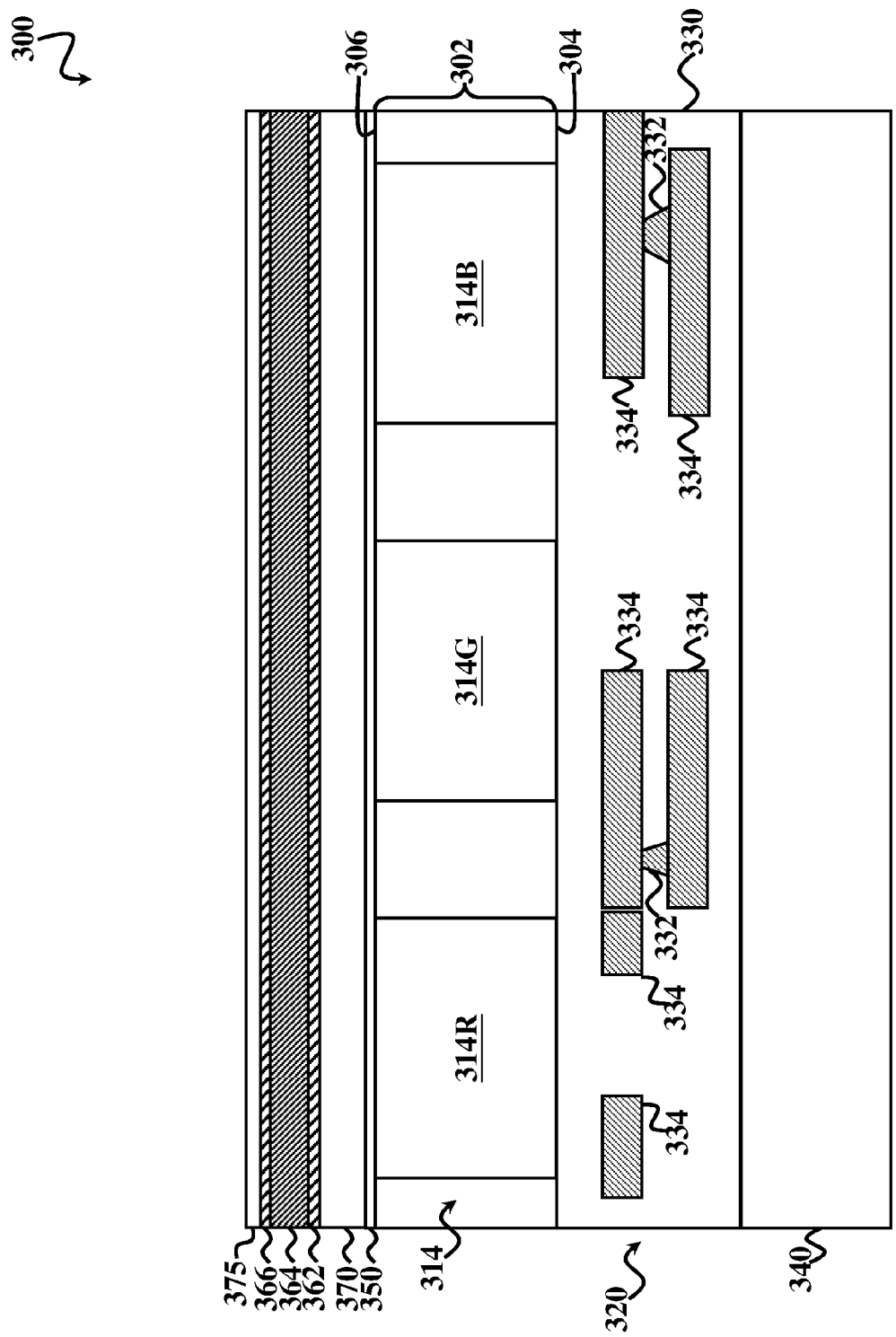
Figure 5:
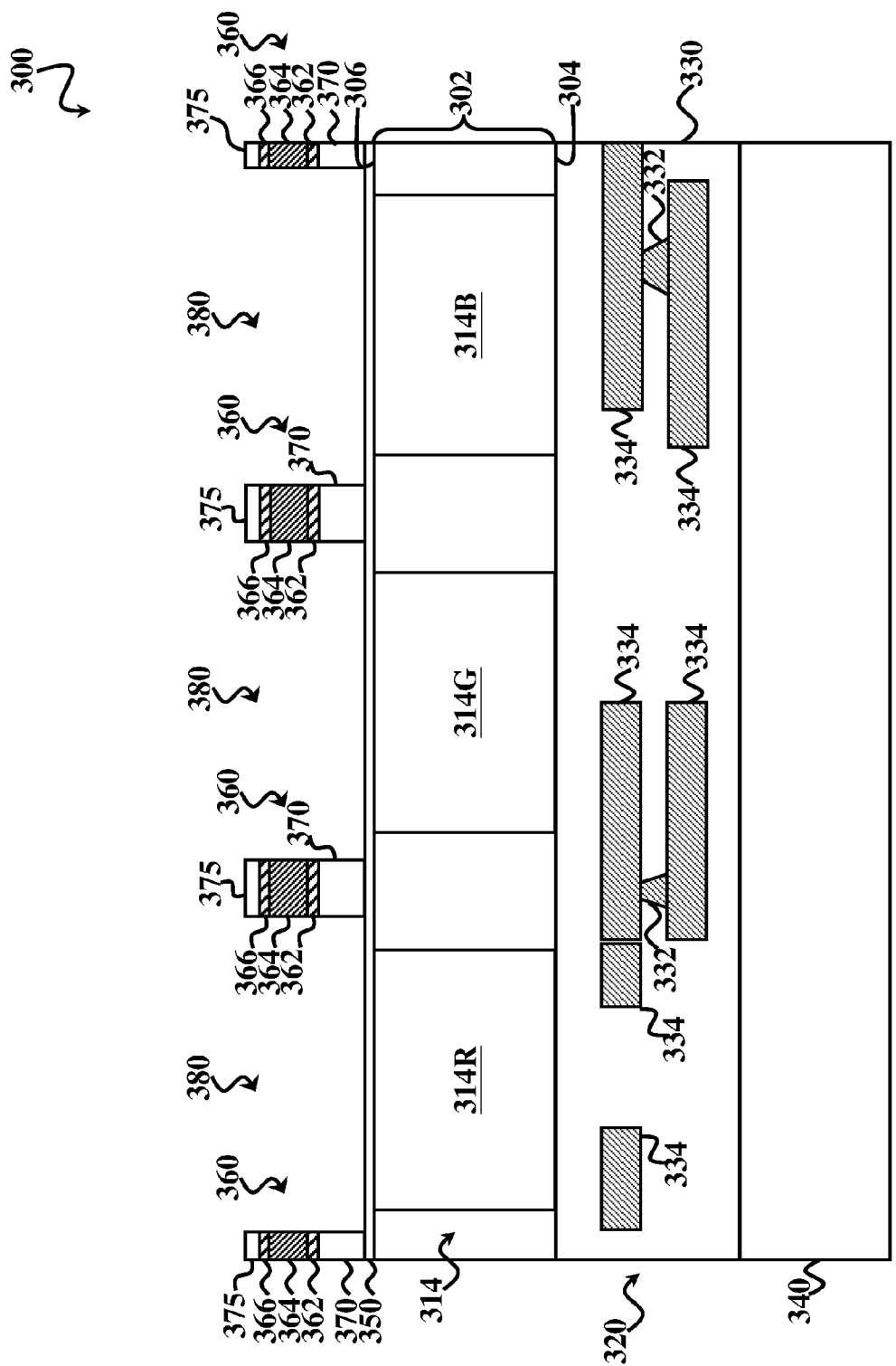

In FIGS. 4 and 5, a radiation-shielding feature is formed over the back surface 306 of the substrate 302. For example, metal layers 362, 364, and 366 are formed over the back surface 306 of the substrate 302. The metal layers 362, 364, and 366 are respectively similar to the metal layers 162, 164, and 166 described above with reference to FIG. 1. In FIG. 4, the metal layers 362, 364, and 366 may be successively deposited by a physical vapor deposition (PVD) process, a chemical vapor deposition (CVD) process, other suitable process, or combination thereof. In FIG. 5, the metal layers 362, 364, and 366 are then subjected to a lithography patterning process and an etching process to form the radiation-shielding feature 360. The lithography patterning process may include photoresist coating (e.g., spin-on coating), soft baking, mask aligning, exposure, post-exposure baking, developing the photoresist, rinsing, drying (e.g., hard baking), other suitable processes, or combinations thereof. Alternatively, the lithography exposing process is implemented or replaced by other methods, such as maskless photolithography, electron-beam writing, or ion-beam writing. In yet another alternative, the lithography patterning process could implement nanoimprint technology. The etching processes include dry etching, wet etching, and/or other etching methods. In the depicted embodiment, a dielectric layer 370 is formed before the metal layers 362, 364, and 366, such that the dielectric layer 370 is disposed between the back surface 306 of the substrate 302 and the metal layers 362, 364, and 366; and an antireflective layer 375 is formed after the metal layers 362, 364, and 366, such that the antireflective layer 375 is disposed over the metal layers 362, 364, and 366. The dielectric layer 370 and antireflective layer 375 are respectively similar to the dielectric layer 170 and antireflective layer 175 described above with reference to FIG. 1.

The lithography patterning and etching process form openings 380 within the metal layers 362, 364, and 366, thereby providing the radiation-shielding feature 360 horizontally disposed between the sensor elements 314, and specifically, between the light sensing regions 314R, 314G, and 314B. In the depicted embodiment, the lithography and etching process extends the openings 380 in the dielectric layer 370 and the antireflective layer 375. As noted above, the dielectric layer 370 and/or antireflective layer 375 may be considered as a feature separate and apart from the radiation-shielding feature 360 or as a portion of the radiation-shielding feature 360.

Figure 6:
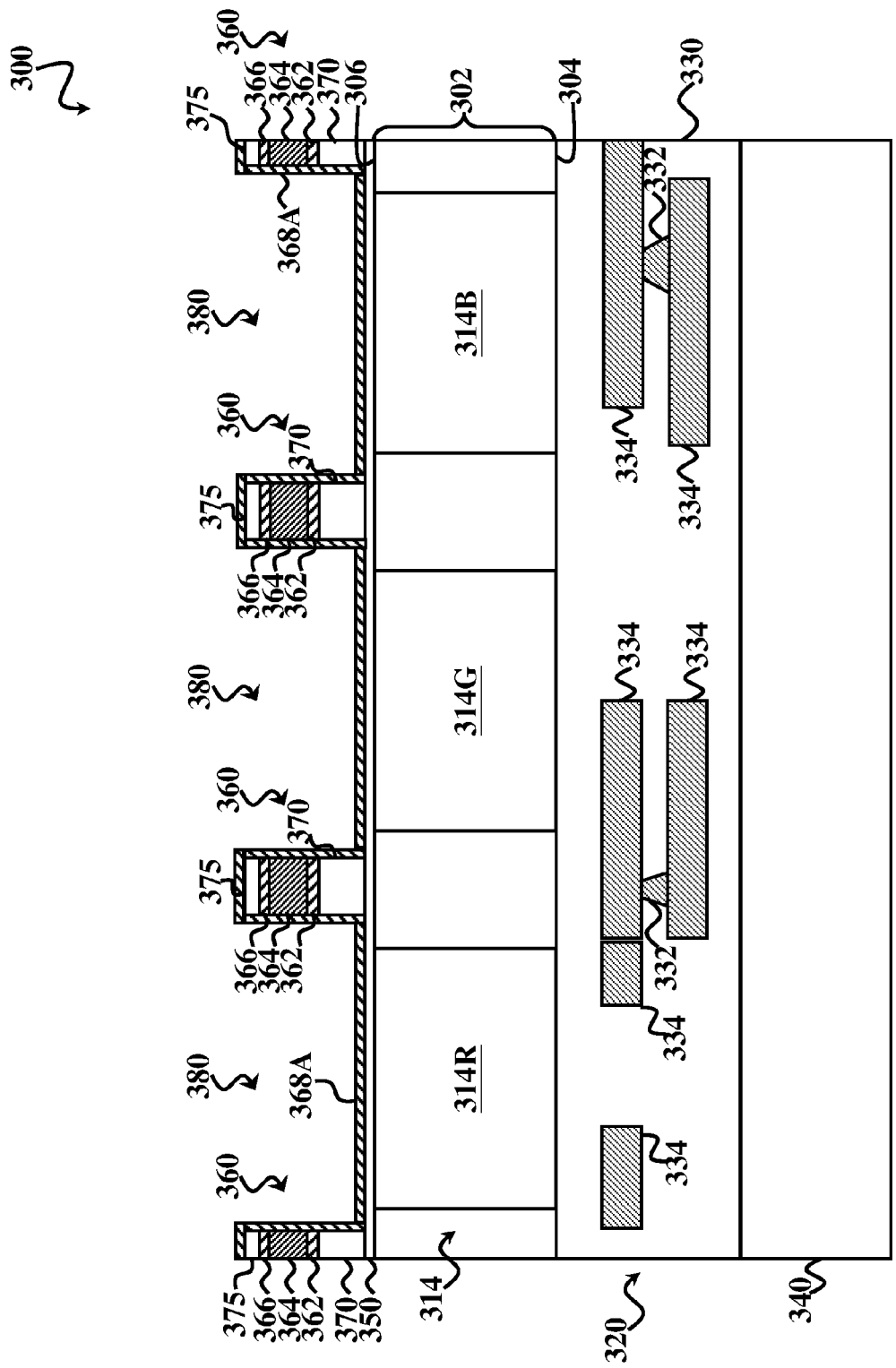
Figure 7:
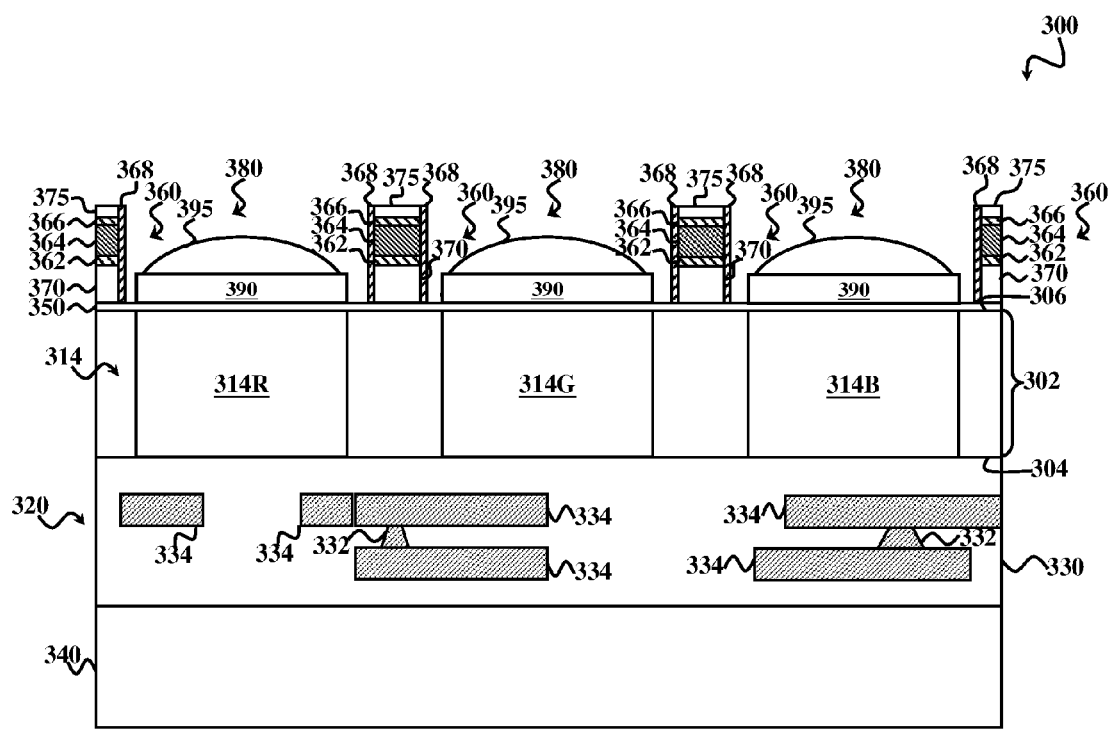

In FIGS. 6 and 7, a metal layer is formed along sidewalls of the radiation-shielding feature 360. The metal layer is formed to a thickness that is sufficient to prevent light transmission. In FIG. 6, a metal layer 368A is formed over the back surface 306 of the substrate 302, including over the radiation-shielding feature 360. The metal layer 368A is similar to the metal layer 168 described above with reference to FIG. 1. The metal layer 368 may be successively deposited by a physical vapor deposition (PVD) process, a chemical vapor deposition (CVD) process, other suitable process, or combination thereof. In FIG. 7, the metal layer 368 is then subjected to an etching process to form metal layers 368 along sidewalls of the radiation-shielding feature 360. The etching process may be a dry etching process, a wet etching process, or combination thereof. In the depicted embodiment, the metal layers 368 extend along sidewalls of the metal layers 362, 364, and 366, and along sidewalls of the dielectric layer 370 and antireflective layer 375. The metal layers 368 may thus be referred to as metal spacers for the radiation-shielding feature 360 the dielectric layer 370, and/or the antireflective layer 375. Thereafter, color filters 390 and lenses 395 may be formed within the openings 380 of the radiation-shielding feature 360. The color filters 390 and lenses 395 are respectively similar to the color filters 190 and lenses 195 described above with reference to FIG. 1.

The present disclosure provides for many different embodiments. For example, an image sensor device includes a substrate having a front surface and a back surface; a plurality of sensor elements disposed at the front surface of the substrate, each of the plurality of sensor elements being operable to sense radiation projected towards the back surface of the substrate; a radiation-shielding feature disposed over the back surface of the substrate and horizontally disposed between each of the plurality of sensor elements; a dielectric feature disposed between the back surface of the substrate and the radiation-shielding feature; and a metal layer disposed along sidewalls of the dielectric feature. The metal layer may be disposed along sidewalls of the radiation-shielding feature. The metal layer may include one of titanium and titanium nitride. The radiation-shielding feature includes a metal feature. The dielectric feature may be an oxide-containing feature. The radiation-shielding feature may include a plurality of metal layers, such as a first titanium-containing layer disposed over the back surface of the substrate, an aluminum-containing layer disposed over the first titanium-containing layer, and a second titanium-containing layer disposed over the aluminum-containing layer. The first and second titanium-containing layers may include titanium nitride, and the aluminum-containing layer may include AlCu. An anti-reflective coating layer may be disposed over the second-titanium containing layer.

In another example, a device includes a substrate having a front surface and a back surface; a plurality of sensor elements disposed at the front surface of the substrate, the plurality of sensor elements being operable to sense radiation projected towards the back surface of the substrate; a metal grid disposed over the back surface of the substrate such that each of the plurality of sensor elements are horizontally separated from each other by the metal grid; an oxide-containing feature disposed between the back surface of the substrate and the metal grid; and a metal layer disposed on sidewalls of the oxide-containing feature. The metal layer may be disposed on sidewalls of the metal grid. The metal layer may include one of titanium and titanium nitride. The metal grid may include a first titanium-containing layer disposed over the back surface of the substrate, an aluminum-containing layer disposed over the first titanium-containing layer, and a second titanium-containing layer disposed over the aluminum-containing layer. The metal grid defines a plurality of openings therein, each of the plurality of sensor elements being disposed within one of the plurality of openings. The device may further include a plurality of microlenses disposed over the back surface of the substrate and within the plurality of openings, respectively, wherein each of the plurality of microlenses is aligned with one of the plurality of sensor elements.

In yet another example, a method includes providing a substrate having a front surface and a back surface, wherein a plurality of sensor elements are disposed at the front surface of the substrate, each of the plurality of sensor elements being operable to sense radiation projected towards the back surface of the substrate; forming a dielectric feature over the back surface of the substrate; forming a radiation-shielding feature over the dielectric feature; and forming a metal layer along sidewalls of the dielectric feature. The method may further include forming the metal layer along sidewalls of the radiation-shielding feature. Forming the radiation-shielding may include forming a plurality of metal layers over the back surface of the substrate, and patterning the plurality of metal layers such that each of the plurality of sensor elements is horizontally disposed between a metal feature. The plurality of metal layers may include a first titanium-containing layer over the back surface of the substrate, an aluminum-containing layer over the first titanium-containing layer, and a second titanium-containing layer over the aluminum-containing layer. Forming the metal layer along sidewalls of the dielectric feature may include forming a metal layer over the back surface of the substrate including over the radiation-shielding feature, and patterning the metal layer such that the metal layer remains along sidewalls of the dielectric feature and the radiation-shielding feature. The method may further include forming a plurality of color filters over the back surface of the substrate, wherein each of the plurality of color filters is aligned with one of the plurality of sensor elements, and forming a plurality of microlenses over the back surface of the substrate, wherein each of the plurality of microlenses is aligned with one of the plurality of sensor elements.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
providing a substrate having a front surface and a back surface, wherein a plurality of sensor elements are disposed at the front surface of the substrate, each of the plurality of sensor elements being operable to sense radiation projected towards the back surface of the substrate;
forming a dielectric feature over the back surface of the substrate;
forming a radiation-shielding feature over the dielectric feature; and
forming a metal layer along sidewalls of the dielectric feature wherein the dielectric feature is formed between the back surface of the substrate and the radiation-shielding feature without being directly over any of the plurality of sensor elements.

2. The method of claim 1, wherein the forming the metal layer along sidewalls of the dielectric feature includes forming the metal layer along sidewalls of the radiation-shielding feature.

3. The method of claim 1, wherein the forming the radiation-shielding feature over the dielectric feature includes:
forming a plurality of metal layers over the dielectric feature; and
patterning the plurality of metal layers such that each of the plurality of sensor elements is horizontally disposed between a metal feature.

4. The method of claim 3, wherein the forming the plurality of metal layers includes:
forming a first titanium-containing layer over the back surface of the substrate;
forming an aluminum-containing layer over the first titanium-containing layer; and
forming a second titanium-containing layer over the aluminum-containing layer.

5. The method of claim 1, wherein the forming the metal layer along sidewalls of the dielectric feature includes:
forming a metal layer over the back surface of the substrate including over the radiation-shielding feature; and
patterning the metal layer such that the metal layer remains along sidewalls of the dielectric feature and sidewalls of the radiation-shielding feature.

6. The method of claim 1, further including:
forming a plurality of color filters over the back surface of the substrate, wherein each of the plurality of color filters is aligned with one of the plurality of sensor elements; and
forming a plurality of microlenses over the back surface of the substrate, wherein each of the plurality of microlenses is aligned with one of the plurality of sensor elements.

7. A method comprising:
forming a sensor element at a first side of a substrate, wherein the sensor element is operable to sense radiation projected towards a second side of the substrate that is opposite the first side;
forming a dielectric layer over the second side of the substrate;
forming a first metal layer over the dielectric layer;
patterning the dielectric layer and the first metal layer to form an opening, wherein the patterned dielectric layer has sidewalls defining the opening wherein the patterned dielectric layer is disposed between the second side of the substrate and the patterned first metal layer without being directly over the sensor element; and
forming a second metal layer along the sidewalls of the patterned dielectric layer.

8. The method of claim 7, further comprising:
forming a color filter within the opening; and
forming a lens over the color filter within the opening.

9. The method of claim 7, further comprising:
forming a third metal layer over the first metal layer;
forming a fourth metal layer over the third metal layer; and
wherein patterning the dielectric layer and the first metal layer to form the opening includes patterning the third metal layer and the fourth metal layer to form the opening.

10. The method of claim 9, wherein the patterned first, third, and fourth metal layers have respective sidewalls defining the opening, and
wherein forming the second metal layer along the sidewalls of the patterned dielectric layer includes forming the second metal layer along the respective sidewalls of the patterned first, third, and fourth metal layers.

11. The method of claim 9, wherein the first metal layer includes titanium,
wherein the third metal layer includes aluminum, and
wherein the fourth metal layer includes titanium.

12. The method of claim 7, further comprising forming an antireflection coating layer over the second side of the substrate, and
wherein patterning the dielectric layer and the first metal layer to form an opening includes the opening exposing a portion of the antireflection coating layer.

13. The method of claim 7, further comprising forming an interconnect structure over the first side of the substrate.

14. The method of claim 7, further comprising forming an antireflection coating layer over the second side of the substrate, and
wherein forming the second metal layer along the sidewalls of the patterned dielectric layer includes:
depositing the second metal layer within the opening and directly on a portion of the antireflection coating layer; and
patterning the second metal layer to expose the portion of the antireflection layer.

15. A method comprising:
forming a first sensor element and a second sensor element at a first surface of a substrate;

forming a dielectric feature over a second surface of the substrate between the first sensor element and the second sensor element, wherein the dielectric feature has a first sidewall and an opposing second sidewall, wherein the second surface of the substrate opposes the first surface of the substrate;

forming a radiation-shielding feature over the second surface between the first sensor element and the second sensor element, wherein the radiation-shielding feature has a third sidewall and an opposing fourth sidewall; and forming a metal layer along the first and second sidewalls of the dielectric feature and the third and fourth sidewalls of the radiation-shielding feature.

16. The method of claim 15, wherein forming the dielectric feature over the second surface of the substrate between the first sensor element and the second sensor element includes:

depositing a dielectric material layer over the second surface; and patterning the dielectric material layer to form the dielectric feature such that the dielectric feature is not directly over the first sensor element and the second sensor element.

17. The method of claim 15, wherein the dielectric feature includes an oxide material.

18. The method of claim 15, wherein forming the radiation-shielding feature over the second surface between the first sensor element and the second sensor element includes:

forming a first metal layer over the dielectric feature; and forming a second metal layer over the first metal layer.

19. The method of claim 18, wherein one of the first and second metal layers includes titanium and the other of the first and second metal layers includes aluminum.

20. The method of claim 15, further comprising forming another dielectric feature over the radiation-shielding feature, and wherein forming the metal layer along the first and second sidewalls of the dielectric feature and the third and fourth sidewalls of the radiation-shielding feature includes forming the metal layer along a sidewall of the another dielectric feature.

\* \* \* \* \*